(12) United States Patent
Cartier et al.

(10) Patent No.: US 8,778,750 B2
(45) Date of Patent: Jul. 15, 2014

(54) TECHNIQUES FOR THE FABRICATION OF THICK GATE DIELECTRIC

(75) Inventors: Eduard Albert Cartier, New York, NY (US); Michael P. Chudzik, Danbury, CT (US); Andreas Kerber, Mount Kisco, NY (US); Siddarth Krishnan, Peekskill, NY (US); Naim Moumen, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 13/464,966

(22) Filed: May 5, 2012

(65) Prior Publication Data

US 2013/0292778 A1 Nov. 7, 2013

(51) Int. Cl.
*H01L 21/8238* (2006.01)
(52) U.S. Cl.
USPC ...... 438/205; 438/294; 257/374; 257/E21.639
(58) Field of Classification Search
CPC .................................................. H01L 21/28097
USPC ................. 438/216, 294, 287, 199, 201, 205; 257/E21.625, E21.639, 375, 374
See application file for complete search history.

(56) References Cited

U.S. PATENT DOCUMENTS

| 7,153,786 | B2 | 12/2006 | Kim et al. |
| 7,211,492 | B2 | 5/2007 | Forbes et al. |
| 7,214,994 | B2 | 5/2007 | Forbes et al. |
| 2005/0081781 | A1* | 4/2005 | Lin et al. ..................... 117/104 |
| 2005/0156256 | A1 | 7/2005 | Kim et al. |
| 2007/0045752 | A1 | 3/2007 | Forbes et al. |
| 2009/0008725 | A1 | 1/2009 | Guha et al. |
| 2009/0011552 | A1* | 1/2009 | Doris et al. ................... 438/199 |

* cited by examiner

*Primary Examiner* — Caridad Everhart
(74) *Attorney, Agent, or Firm* — Vazken Alexanian; Michael J. Chang, LLC

(57) ABSTRACT

A method for fabricating a CMOS device includes the following steps. A wafer is provided. STI is used to form at least one active area in the wafer. A silicon oxide layer is deposited onto the wafer covering the active area. A first high-k material is deposited onto the silicon oxide layer. Portions of the silicon oxide layer and the first high-k material are selectively removed, such that the silicon oxide layer and the first high-k material remain over one or more first regions of the active area and are removed from over one or more second regions of the active area. A second high-k material is deposited onto the first high-k material over the one or more first regions of the active area and onto a surface of the wafer in the one or more second regions of the active area. A CMOS device is also provided.

19 Claims, 7 Drawing Sheets

TECHNIQUES FOR THE FABRICATION OF THICK GATE DIELECTRIC

FIELD OF THE INVENTION

The present invention relates to complementary metal-oxide semiconductor (CMOS) devices and more particularly, to techniques for fabricating a thick gate dielectric for a CMOS device.

BACKGROUND OF THE INVENTION

Complementary metal-oxide semiconductor (CMOS) devices typically employ at least one gate which is separated from a channel (or channels) of the device by a gate dielectric. The gate dielectric is commonly an oxide material. Conventionally, gate oxides are formed using a thermal oxidation process. Thermal oxidation works well when the material on which the oxide is being formed is pure silicon.

However, when thermal oxidation is employed on substrates other than pure silicon (Si), the resulting oxide may not be a suitable gate dielectric material. For instance, when the thermal oxide is grown on a silicon germanium (SiGe) substrate, the germanium (Ge) can become incorporated into the growing oxide. Ge oxidizes faster than silicon and can cause a separation of the Si and Ge. Also, Germanium oxide ($GeO_2$) is unstable and soluble in water, both of which are undesirable properties for a gate dielectric.

Accordingly, improved gate dielectric fabrication processes would be desirable.

SUMMARY OF THE INVENTION

The present invention provides techniques for fabricating a thick gate dielectric for a complementary metal-oxide semiconductor (CMOS) device. In one aspect of the invention, a method for fabricating a CMOS device is provided. The method includes the following steps. A wafer is provided. Shallow trench isolation is used to form at least one active area in the wafer. A silicon oxide layer is deposited onto the wafer covering the active area. A first high-k material is deposited onto the silicon oxide layer. Portions of the silicon oxide layer and the first high-k material are selectively removed exposing a surface of the wafer, such that the silicon oxide layer and the first high-k material remain over one or more first regions of the active area and the silicon oxide layer and the first high-k material are removed from over one or more second regions of the active area. A second high-k material is deposited onto the first high-k material over the one or more first regions of the active area and onto the surface of the wafer in the one or more second regions of the active area. A combination of the first high-k material and the second high-k material forms a multilayer gate dielectric over the one or more first regions of the active layer and the second high-k material forms a single layer gate dielectric over the one or more second regions of the active area.

In another aspect of the invention, a CMOS device is provided. The CMOS device includes a wafer having at least one active area formed therein by shallow trench isolation; a silicon oxide layer on the wafer and a multilayer gate dielectric on the silicon oxide layer over one or more first regions of the active area, wherein the multilayer gate dielectric includes a first high-k material and a second high-k material on the first high-k material; and a single layer gate dielectric on the wafer over one or more second regions of the active area, wherein the single layer gate dielectric includes the second high-k material. The CMOS device may further include gates over the single layer gate dielectric and the multilayer gate dielectric.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating a thick gate dielectric for a complementary metal-oxide semiconductor (CMOS) device. In the exemplary embodiment now presented, both a thick gate dielectric and a thin gate dielectric will be formed at the same time, using the same (multilayer) fabrication process.

Figure 1:
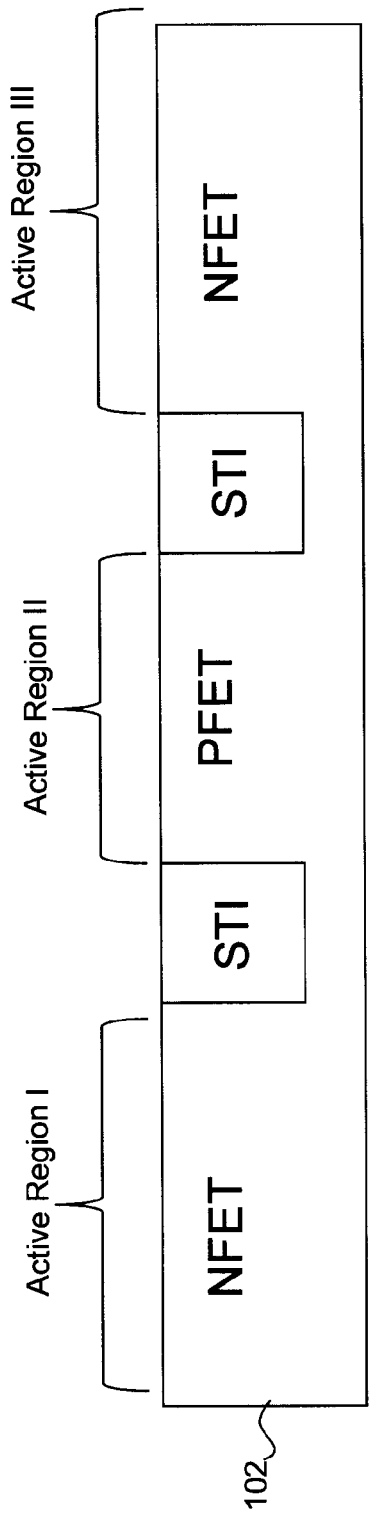
FIG. 1 is a cross-sectional diagram illustrating a starting structure for a complementary metal-oxide semiconductor (CMOS) device fabrication process, i.e., a wafer having one or more active areas defined therein using shallow trench isolation (STI) according to an embodiment of the present invention.

FIG. 1 is a cross-sectional diagram illustrating a starting structure for the fabrication process, specifically, a wafer 102 having one or more active areas defined therein using shallow trench isolation (STI). By way example only, at least one thick gate dielectric region and at least one thin gate dielectric region will be formed in each active area using the present techniques. Further, according to one exemplary embodiment, at least one transistor device will be formed in each of the active areas, e.g., n-channel field effect transistors (NFETs) having both thick and thin gate dielectrics or p-channel field effect transistors (PFETs) having both thick and thin gate dielectrics, see FIG. 1.

According to an exemplary embodiment, the starting wafer 102 is a bulk silicon (Si), germanium (Ge) or silicon germanium (SiGe) wafer. As is known in the art, STI involves first patterning one or more trenches in the wafer 102. The trenches are then filled with a dielectric material or materials, such as silicon dioxide ($SiO_2$). Any excess dielectric overfilling the trenches can be removed using chemical mechanical polishing (CMP) or some other suitable planarization technique.

The STI regions in the wafer 102 will isolate the various regions of the CMOS device. As highlighted above, the present techniques are directed to fabricating thick gate dielectrics (CMOS PFET and NFET) and thin gate dielectrics (CMOS NFET and PFET) at the same time by using high-k materials in a multilayer fabrication process. Thus, the depiction of two NFET regions and a single PFET region in FIG. 1 is merely exemplary. Any combination of field-effect transistors may be fabricated in accordance with the present techniques.

Figure 2:
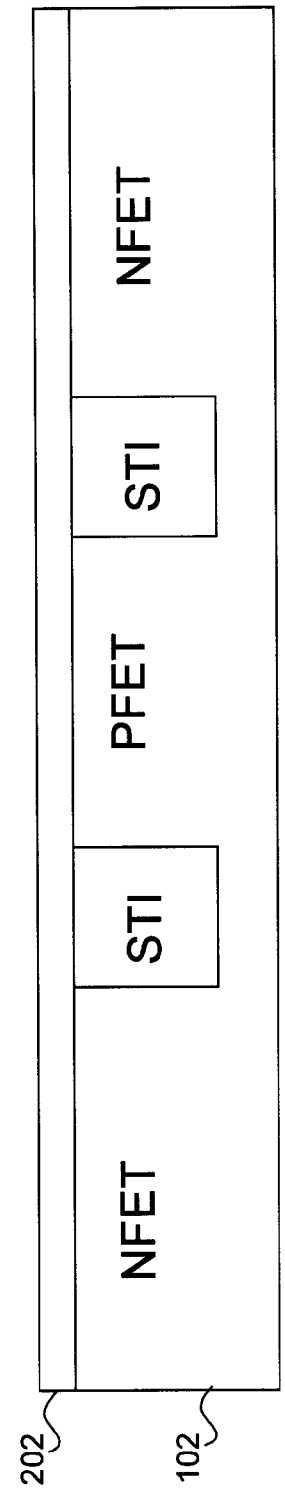
FIG. 2 is a cross-sectional diagram illustrating a silicon oxide layer having been deposited onto the wafer, covering the active areas according to an embodiment of the present invention.

A silicon oxide layer 202 is deposited onto/formed on the wafer 102, covering the active areas. See FIG. 2. By way of example only, silicon oxide layer 202 can be formed from silicon dioxide ($SiO_2$). According to an exemplary embodiment, the silicon oxide layer 202 is deposited onto the wafer using atomic layer deposition (ALD) or chemical vapor deposition (CVD) to a thickness of from about 10 angstroms (Å) to about 80 Å, e.g., from about 20 Å to about 50 Å. Alternatively, when the wafer 102 is a bulk silicon wafer, the silicon oxide layer 202 may also be formed (grown) on the wafer by a thermal oxidation process also to a thickness of from about 10 Å to about 80 Å, e.g., from about 20 Å to about 50 Å. Silicon oxide produced in this manner is also referred to herein as a thermal oxide. By way of example only, this thermal oxidation process is carried out in a furnace at a temperature of from about 800° C. to about 1,200° C.

Figure 3:
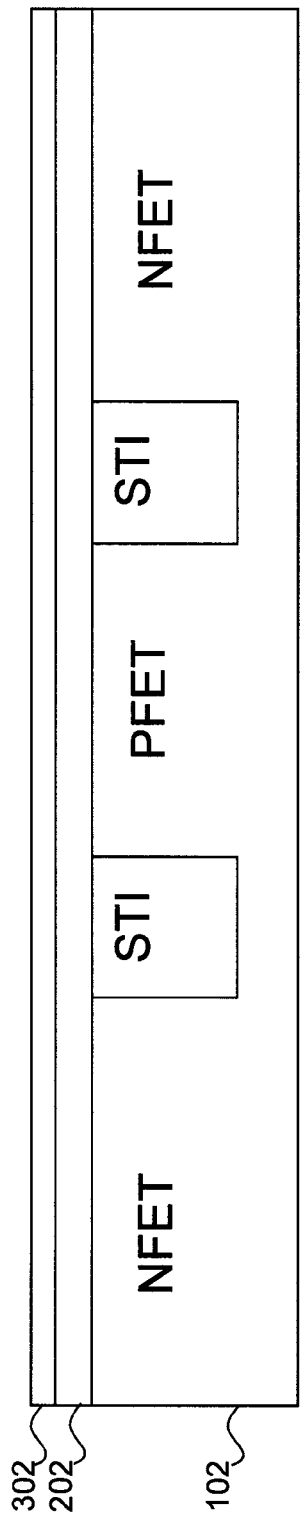
FIG. 3 is a cross-sectional diagram illustrating a first high-k material having been deposited onto the silicon oxide layer according to an embodiment of the present invention.

A high-k material 302 is then deposited onto the silicon oxide layer 202. See FIG. 3. Suitable high-k materials include, but are not limited to, an oxide, nitride, oxynitride and/or silicate including metal silicates and nitrided metal silicates. In one embodiment, the high-k material 302 is comprised of an oxide such as, for example, hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$), yttrium oxide ($Y_2O_3$) and mixtures thereof. Other examples of suitable high-k materials include hafnium silicate and hafnium silicon. According to an exemplary embodiment, the high-k material 302 is deposited onto the silicon oxide layer 202 using ALD or CVD to a thickness of from about 10 Å to about 40 Å.

Figure 4:
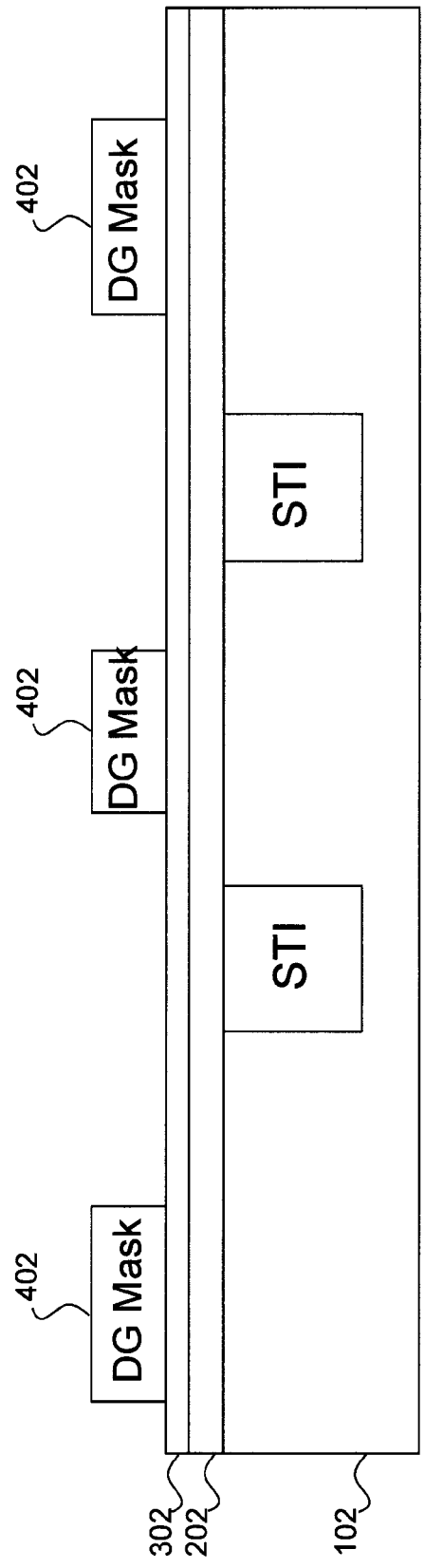
FIG. 4 is a cross-sectional diagram illustrating a photoresist mask having been formed covering regions of the wafer in which a thick gate dielectric will be formed according to an embodiment of the present invention.

Portions of the silicon oxide layer 202 and the high-k material 302 are removed from over one or more regions of the wafer in which a thin gate dielectric will be formed (referred to also hereinafter as "thin gate dielectric regions"). To do so, a photoresist mask 402 (labeled "DG Mask") is formed on the high-k material 302 over/covering the regions of the wafer in which the silicon oxide layer 202 and the high-k material 302 will remain, i.e., over those regions in which a thick gate dielectric will be formed (referred to hereinafter also as "thick gate dielectric regions"). See FIG. 4.

Processes that may be employed for forming a photoresist mask are known to those of skill in the art. In general however, the process for forming photoresist mask 402 can involve depositing a photoresist material, such as Poly(methyl methacrylate) (PMMA) onto the high-k material 302. Depositing the photoresist material using a spin-coating process ensures uniform coverage. Other suitable photoresist materials include, but are not limited to, Poly(methyl glutarimide) (PMGI) and Phenol formaldehyde resin. The deposited photoresist material can then be patterned using electron-beam (e-beam), deep UV light or x-rays. Post patterning, the result is the photoresist masks 402.

Figure 5:
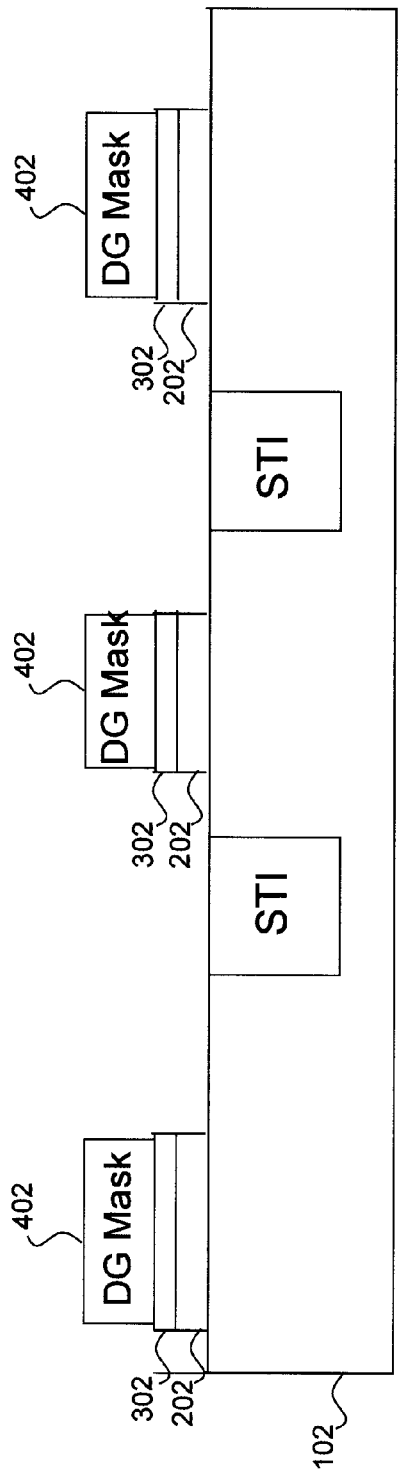
FIG. 5 is a cross-sectional diagram illustrating unmasked portions of the silicon oxide layer and the high-k material having been removed according to an embodiment of the present invention.

A wet etch is then used to remove portions of the silicon oxide layer 202 and the high-k material 302 not masked (un-masked portions). As highlighted above, this removal will occur in regions of the wafer in which a thin gate dielectric will be formed. Suitable wet etchants include, but are not limited to, hydrofluoric (HF) acid. The result of the wet etching process is shown in FIG. 5. As shown in FIG. 5, the silicon oxide layer 202 and the high-k material 302 remain only in those regions of the wafer in which a thick gate dielectric will be formed (see below).

At this point in the process, any of the photoresist masks 402 remaining after the wet etch are also removed. They may be removed using a standard wet etching (e.g., HF acid) or dry etching process, such as reactive ion etching (RIE). Following removal of the photoresist masks 402, an interface clean step is preferably performed to etch the surface of the remaining high-k material 302 in preparation for the subsequent deposition of a second high-k material layer (see below). According to an exemplary embodiment, this surface cleaning process is performed using a dilute HF solution. For example, the HF acid can be diluted with distilled water. Suitable dilution ratios are from about 10:1 $H_2O$:HF to about 500:1 $H_2O$:HF.

Next, a second high-k material layer (high-k material 302 is the first high-k layer), i.e., high-k material 602, is deposited onto the wafer. See FIG. 6. In the thick gate dielectric regions of the wafer, the high-k material 602 layer will be on top of the portions of the high-k material 302 layer remaining after the wet etch. Thus, in these regions, the high-k material 602 will add to the thickness of high-k material 302, resulting in a thicker, multilayer gate dielectric (also referred to herein as a double gate dielectric or DG). By contrast, in the thin gate dielectric regions, the silicon oxide layer 202 and the high-k material 302 have been removed. See above description. Thus, the high-k material 602 in this step will be deposited onto the (exposed) surface of the wafer 102. Accordingly, a single layer of the high-k material 602 will now be present in those thin gate dielectric regions (also referred to herein as a single gate dielectric or SG).

Suitable high-k materials for forming the high-k material 602 include, but are not limited to, an oxide, nitride, oxynitride and/or silicate including metal silicates and nitrided metal silicates. In one embodiment, the high-k material 602 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of suitable high-k materials include hafnium silicate and hafnium silicon. According to an exemplary embodiment, the high-k material 602 is deposited using ALD or CVD to a thickness of from about 10 Å to about 40 Å.

Accordingly, in the thick gate dielectric regions, the multilayer high-k material 302/high-k material 602 forms the gate dielectric, and in the thin gate dielectric regions the single layer high-k material 602 forms the gate dielectric. Therefore, in one exemplary embodiment, the gate dielectric in the thick gate dielectric regions has a thickness of from about 20 Å to about 80 Å (based on the combined thicknesses of the high-k material 302/the high-k material 602), and the gate dielectric in the thin gate regions has a thickness of from about 10 Å to about 40 Å (based on the thickness of the high-k material 602).

Figure 6:
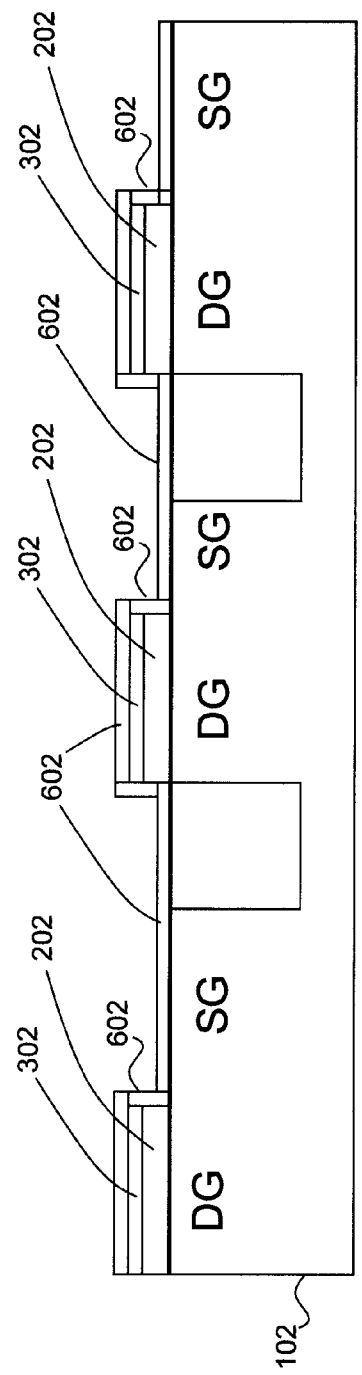
FIG. 6 is a cross-sectional diagram illustrating a second high-k material having been deposited onto the wafer forming thick and thin gate dielectric regions according to an embodiment of the present invention.

The remainder of the process described below is merely exemplary, as various different gate configurations can be employed based on the platform shown in FIG. 6. By way of example only, the number of thick gate dielectric regions and thin gate dielectric regions formed are application-specific and the number of thick/thin gate dielectric regions does not have to be equal. Further, the placement of the thick and thin gate dielectric regions on the wafer can vary, i.e., the thick and thin gate dielectric regions do not have to be close to each other on the circuit.

Figure 7:
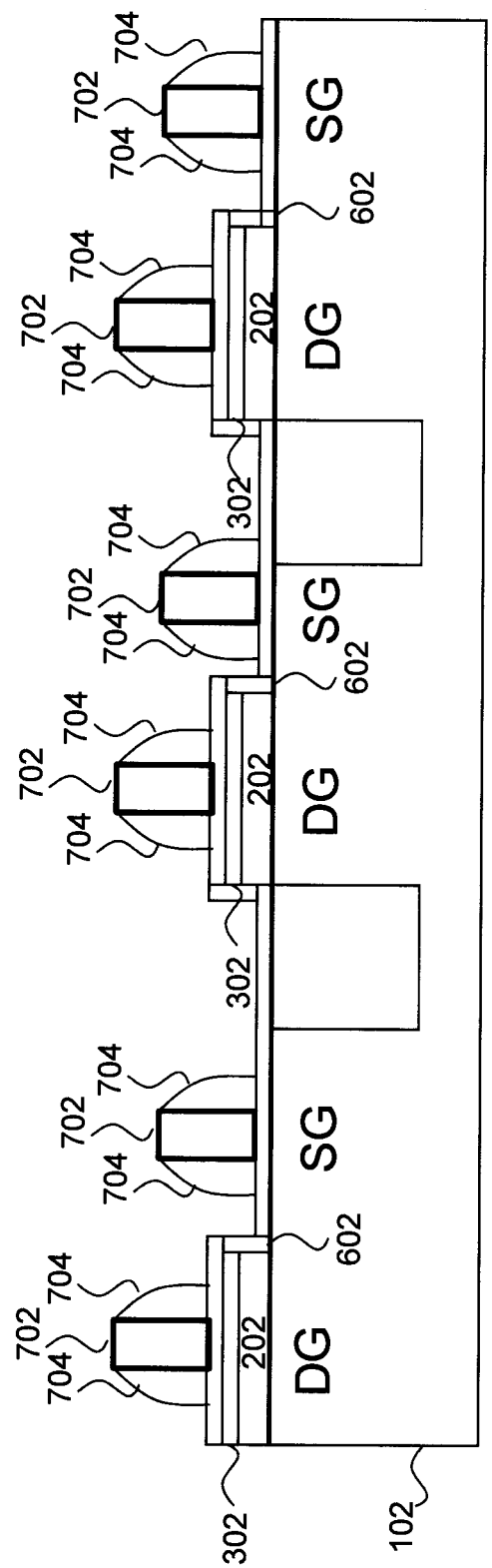
FIG. 7 is a cross-sectional diagram illustrating a plurality of gates having been formed on the thick and thin gate dielectric regions according to an embodiment of the present invention.

In the example shown in FIG. 7, a plurality of gates 702 are formed on the thick and thin gate dielectric regions. In the exemplary configuration shown in FIG. 7, one gate 702 is formed over the thick gate dielectric region and another gate 702 is formed over the thin oxide region in each of the active areas. As highlighted above, this configuration is merely exemplary.

The gates 702 can be formed by first depositing a suitable gate material(s) onto the wafer, covering the thick and thin gate dielectric layer(s). The gate material is then patterned to form the gates 702. Suitable gate materials include, but are not limited to, a metal(s) (such as aluminum, nickel and/or platinum) and/or doped poly-silicon. In the simplest case, the same gate material is used to form each of the gates 702. In that case, the given gate material can be blanket deposited over the wafer and then patterned to remove gate material from all but those areas over the gate dielectrics where it is desired.

Alternatively, one or more of the gates 702 may be formed from a different gate material. When a different gate material is employed, a first gate material (e.g., metal(s) or poly-silicon) can be blanket deposited over the wafer and then patterned to remove that first gate material from all but those areas over the gate dielectric(s) in which it is desired. Next, a second gate material can be blanket deposited over the wafer (and the first gate material) and then patterned to remove that second gate material from all but those areas over the gate dielectric(s) in which it is desired.

Next, as shown in FIG. 7, spacers 704 are formed on opposite sides of each of the gates 702. According to an exemplary embodiment, spacers 704 each are formed from a nitride material, such as silicon nitride (SiN). According to an exemplary embodiment, the spacer material (e.g., SiN) is blanket deposited on the wafer, and then patterned (e.g., using reactive ion etching (RIE)) to form the spacers 704. Conventional source/drain implantation techniques may then be used to form source and drain regions in the wafer 102 adjacent to each of the gates 702. Of course the dopants employed will vary depending on whether an NFET or a PFET is desired. By way of example only, phosphorous or arsenic are suitable dopants for NFETs and boron is a suitable dopant for PFETs.

In one exemplary configuration, each active area of the wafer will contain at least one thick gate dielectric and at least one thin gate dielectric NFET or PFET device. For instance, by way of reference to FIGS. 1 and 7, Active Region I might contain both a thick gate dielectric NFET and a thin gate dielectric NFET. Active Region II might contain both a thick gate dielectric PFET and a thin gate dielectric PFET, and so on. Each NFET/PFET device contains a source region and a drain region interconnected by a channel region, and a gate (gate 702) separated from the channel region by the respective thick or thin gate dielectric. The thick gate dielectric devices are mainly used as Input and Output devices (I/O) and run at higher a voltage (e.g., from about 2 volts to about 2.5 volts). The thin gate dielectric devices are the high performance devices and run at a lower voltage (e.g., from about 0.9 volts to about 1 volt).

Performance of gate dielectrics formed using the present techniques was evaluated. In one implementation, samples were prepared (using the present techniques) having a single layer $HfO_2$ gate dielectric (SG) with a thickness of about 17 Å and a double layer (multilayer) $HfO_2$ gate dielectric (DG) each layer having a thickness of about 17 Å (for a total thickness of the two layers being 34 Å). The SG and DG were formed on high temperature oxide (HTO) substrates of three different thicknesses, 33 Å, 35 Å and 38 Å. The high temperature oxide thickness was varied to attain the same inversion capacitance (Tinv) for the SG and DG samples.

Figure 8:
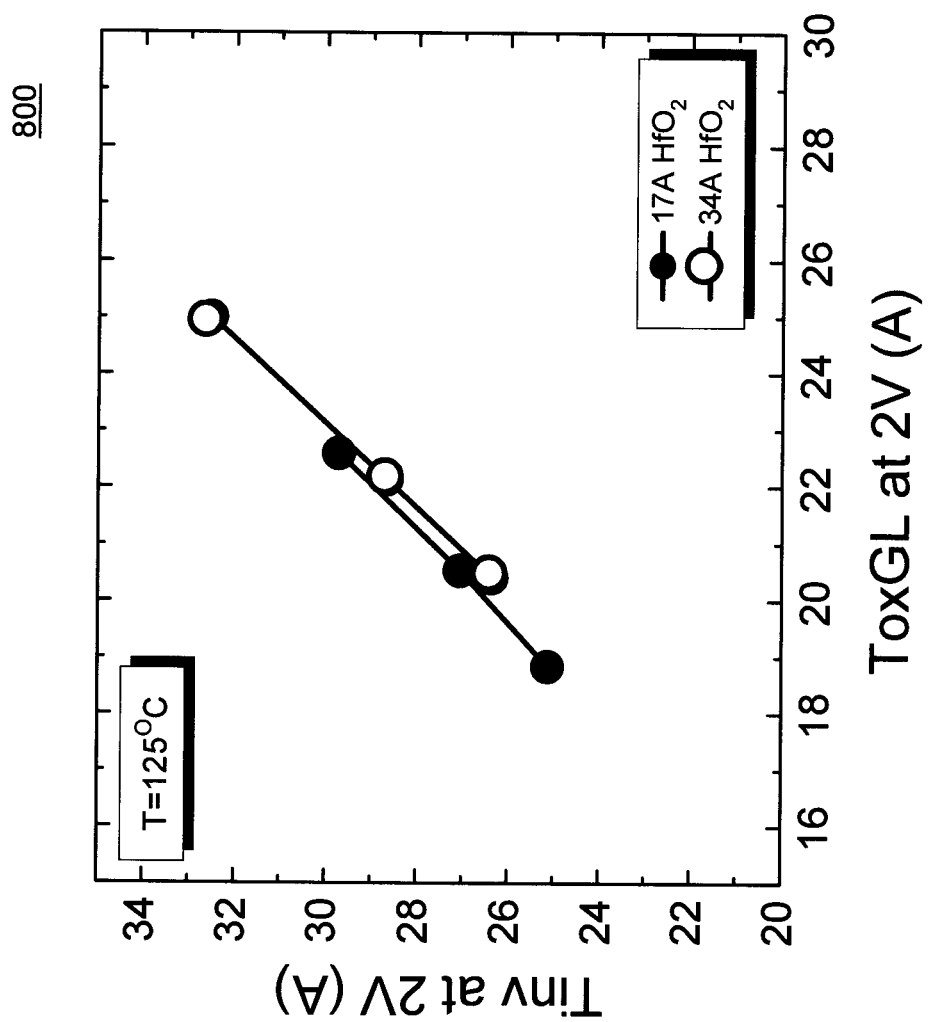
FIG. 8 is a graph illustrating how a relation between capacitance (Tinv) and gate leakage (ToxGL) is not changed by the present multilayer gate dielectric process according to an embodiment of the present invention.

FIG. 8 is a graph 800 illustrating how a relation between capacitance (Tinv) and gate leakage (ToxGL), both measured in amps (A) is not changed by the present multilayer gate dielectric (DG) process. Namely, as shown in FIG. 8, at the same inversion capacitance, the same gate leakage can be obtained with the DG (34 Å $HfO_2$) samples as with the SG (17 Å $HfO_2$) samples. Thus, gate stacks with the present SG and DG gate dielectric are interchangeable from a scaling/leakage perspective.

Figure 9:
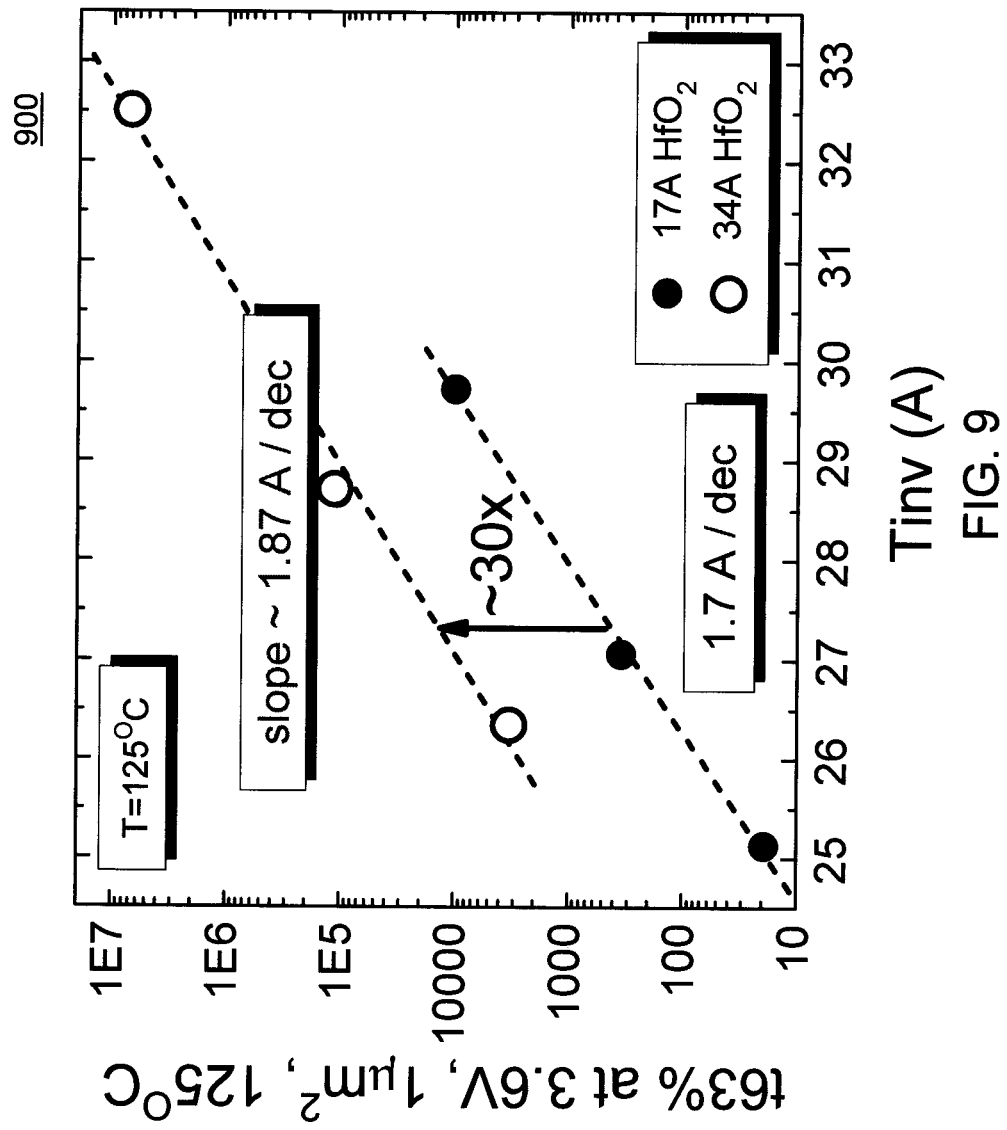
FIG. 9 is a graph illustrating a lifetime comparison of single layer gate dielectric and double layer gate dielectric samples at stress according to an embodiment of the present invention.

Advantageously, it was also found that, at stress, the multilayer gate dielectric samples had about a 30× longer lifetime than the single layer samples at the same Tinv. See FIG. 9. FIG. 9 is a graph 900 illustrating a lifetime comparison of single layer gate dielectric and double layer gate dielectric samples, prepared using the present techniques, at stress. As above, the double layer (DG) $HfO_2$ samples were 34 Å thick and the single layer (SG) $HfO_2$ samples were 17 Å thick. The notation t63% at 3.6V indicates the time at which 63% of devices are non-functional or failed (permanent). 63% is the characteristic parameter of the Weibull cumulative distribution used for standard data reporting. Dec stands for 10×. As is apparent from FIG. 9, lifetime at stress increased by about 30 times (from SG to DG samples) for the same Tinv and gate leakage.

Figure 10:
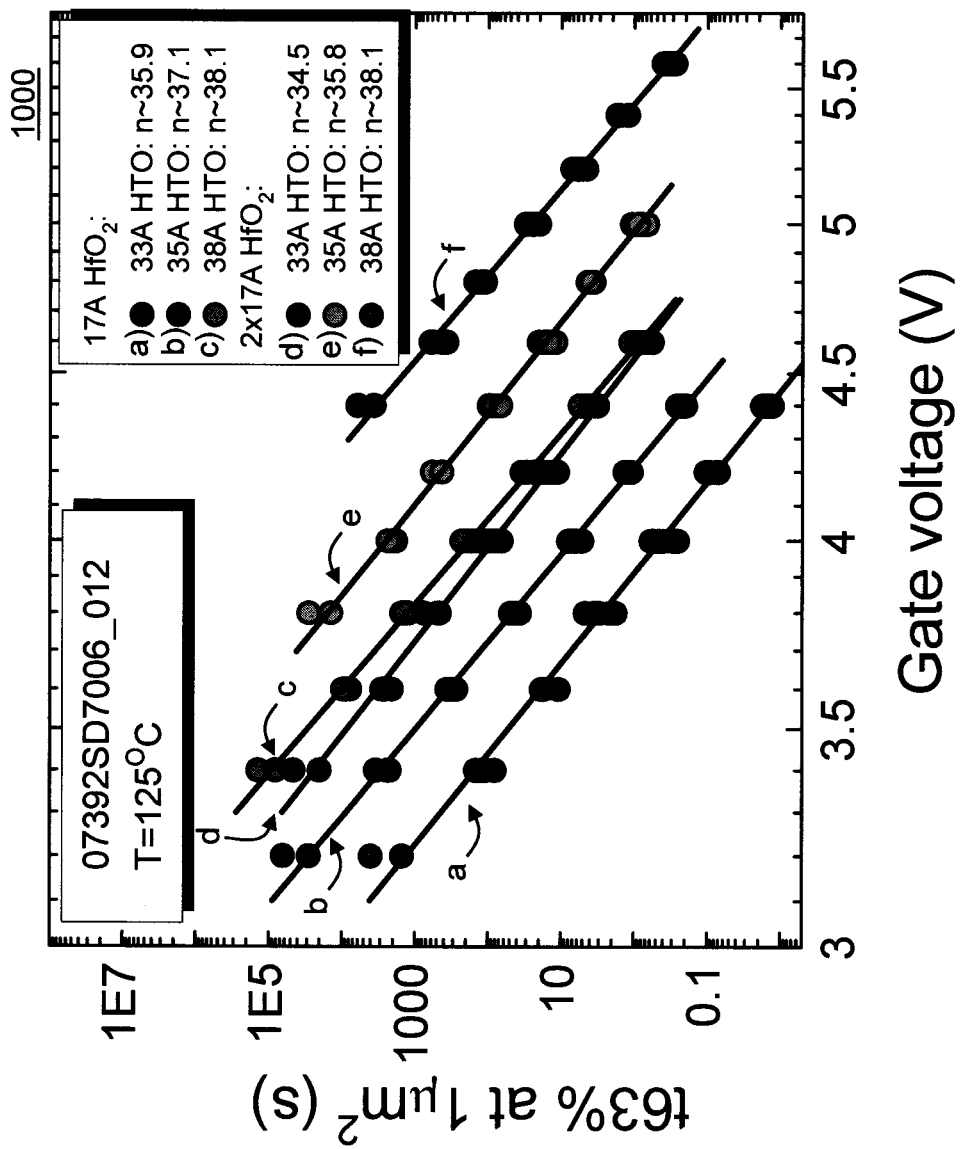
FIG. 10 is a graph illustrating time-dependent dielectric breakdown (TDDB) voltage acceleration results of single layer gate dielectric and double layer gate dielectric samples according to an embodiment of the present invention.

Time-dependent dielectric breakdown (TDDB) voltage acceleration results of the above-described samples (i.e., prepared using the present techniques having a single layer $HfO_2$ gate dielectric with a thickness of about 17 Å and a double layer gate dielectric each layer having a thickness of about 17 Å) are shown in graph 1000 of FIG. 10. As described above, dielectric samples were prepared on high temperature oxide substrates of three different thicknesses, 33 Å, 35 Å and 38 Å. As shown in FIG. 10, comparable voltage acceleration was obtained for the single layer and multilayer dielectric deposition processes. An increase in acceleration factor was seen with an increase in high temperature oxide thickness.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a complementary metal-oxide semiconductor (CMOS) device, the method comprising the steps of:

providing a wafer;
   using shallow trench isolation (STI) to form at least one active area in the wafer by forming STI regions in the wafer that define the active area;
   depositing a silicon oxide layer onto the wafer covering the active area;

depositing a first high-k material onto the silicon oxide layer;

selectively removing portions of the silicon oxide layer and the first high-k material exposing a surface of the wafer, such that the silicon oxide layer and the first high-k material remain over one or more first regions of the active area and the silicon oxide layer and the first high-k material are removed from over one or more second regions of the active area;

depositing a second high-k material onto the first high-k material over the one or more first regions of the active area and onto the surface of the wafer in the one or more second regions of the active area, wherein a combination of the first high-k material and the second high-k material forms a multilayer gate dielectric over the one or more first regions of the active area and the second high-k material forms a single layer gate dielectric over the one or more second regions of the active area; and forming gates in the active area over i) the multilayer gate dielectric formed from the combination of the first high-k material and the second high-k material and ii) the single layer gate dielectric formed from the second high-k material, such that the active area will contain at least one multilayer, thick gate dielectric device and at least one single layer, thin gate dielectric device.

2. The method of claim 1, wherein the wafer is a bulk silicon, germanium or silicon germanium wafer.

3. The method of claim 1, wherein the silicon oxide layer is deposited using atomic layer deposition or chemical vapor deposition.

4. The method of claim 1, wherein the silicon oxide layer is deposited to a thickness of from about 10 Angstroms to about 80 Angstroms.

5. The method of claim 1, wherein the silicon oxide layer is deposited to a thickness of from about 20 Angstroms to about 50 Angstroms.

6. The method of claim 1, wherein the first high-k material and the second high-k material are each selected from the group consisting of hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$), yttrium oxide ($Y_2O_3$) and mixtures thereof.

7. The method of claim 1, wherein the first high-k material and the second high-k material are each deposited using atomic layer deposition or chemical vapor deposition.

8. The method of claim 1, wherein the first high-k material and the second high-k material are each deposited to a thickness of from about 10 Angstroms to about 40 Angstroms.

9. The method of claim 1, wherein at least one of the gates is formed from a different gate material than one or more other of the gates.

10. The method of claim 1, wherein the step of selectively removing the portions of the silicon oxide layer and the first high-k material, comprises the steps of:

patterning a photoresist mask on the first high-k material over the one or more first regions of the active area; and etching the silicon oxide layer and the first high-k material using the photoresist mask so as to remove the silicon oxide layer and the first high-k material from over the one or more second regions of the active area.

11. The method of claim 10, wherein the step of etching the silicon oxide layer and the first high-k material is performed using a wet etch.

12. The method of claim 11, wherein the wet etch comprises hydrofluoric acid.

13. The method of claim 1, further comprising the step of:

performing an interface cleaning process to etch remaining portions of the first high-k material.

14. The method of claim 13, wherein the interface cleaning process is performed using a dilute hydrofluoric acid solution.

15. The method of claim 1, wherein the gates comprise one or more of a metal and doped poly-silicon.

16. The method of claim 15, wherein the metal comprises one or more of aluminum, nickel and platinum.

17. A CMOS device, comprising:

a wafer having at least one active area formed therein by shallow trench isolation (STI) wherein STI regions formed in the wafer define the active area;

a silicon oxide layer on the wafer and a multilayer gate dielectric on the silicon oxide layer over one or more first regions of the active area, wherein the multilayer gate dielectric comprises a combination of a first high-k material and a second high-k material on the first high-k material;

a single layer gate dielectric on the wafer over one or more second regions of the active area, wherein the single layer gate dielectric comprises the second high-k material; and gates in the active area over i) the multilayer gate dielectric formed from the combination of the first high-k material and a second high-k material and ii) the single layer gate dielectric formed from the second high-k material, such that the active area contains at least one multilayer, thick gate dielectric device and at least one single layer, thin gate dielectric device.

18. The CMOS device of claim 17, wherein the first high-k material and the second high-k material are each selected from the group consisting of hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$), yttrium oxide ($Y_2O_3$) and mixtures thereof.

19. The CMOS device of claim 17, wherein the first high-k material and the second high-k material each have a thickness of from about 10 Angstroms to about 40 Angstroms.

* * * * *